United States Patent
Kao et al.

(10) Patent No.: US 10,128,171 B1
(45) Date of Patent: Nov. 13, 2018

(54) LEADFRAME WITH IMPROVED HALF-ETCH LAYOUT TO REDUCE DEFECTS CAUSED DURING SINGULATION

(71) Applicant: Marvell International Ltd., Hamilton (BM)

(72) Inventors: Huahung Kao, San Jose, CA (US); Shiann-Ming Liou, Campbell, CA (US)

(73) Assignee: Marvell International Ltd., Hamilton (BM)

( * ) Notice: Subject to any disclaimer, the term of this patent is extended or adjusted under 35 U.S.C. 154(b) by 1 day.

(21) Appl. No.: 15/468,827

(22) Filed: Mar. 24, 2017

Related U.S. Application Data (60) Provisional application No. 62/313,680, filed on Mar. 25, 2016.

(51) Int. Cl.
| | |
|---|---|
| *H01L 21/00* | (2006.01) |
| *H01L 23/495* | (2006.01) |
| *H01L 21/78* | (2006.01) |
| *H01L 21/48* | (2006.01) |
| *H01L 21/56* | (2006.01) |

(52) U.S. Cl.
CPC .... *H01L 23/49541* (2013.01); *H01L 21/4828* (2013.01); *H01L 21/4842* (2013.01); *H01L 21/561* (2013.01); *H01L 21/565* (2013.01); *H01L 21/78* (2013.01); *H01L 23/49537* (2013.01)

(58) Field of Classification Search
CPC ............. H01L 23/495; H01L 23/49548; H01L 22/49541; H01L 33/38; H01L 33/20
USPC .................. 257/666, 676; 438/111, 123, 124
See application file for complete search history.

(56) References Cited

U.S. PATENT DOCUMENTS

| | | | |
|---|---|---|---|
| 6,847,099 B1* | 1/2005 | Bancod | H01L 21/4821 257/666 |
| 7,132,733 B2* | 11/2006 | Itou | H01L 21/4828 257/666 |
| 7,947,534 B2* | 5/2011 | Punzalan | H01L 23/3107 257/666 |
| 8,836,091 B1* | 9/2014 | Yow | H01L 23/49503 257/666 |
| 2005/0029636 A1* | 2/2005 | Paek | H01L 23/3107 257/666 |
| 2008/0111215 A1* | 5/2008 | Shim, II | H01L 21/565 257/666 |
| 2012/0126378 A1* | 5/2012 | San Antonio | H01L 21/561 257/659 |
| 2014/0001616 A1* | 1/2014 | Daniels | H01L 24/97 257/676 |

\* cited by examiner

*Primary Examiner* — S. V. Clark (57) ABSTRACT

A leadframe matrix for mounting and packaging semiconductor dice includes a plurality of leadframes each including leads arranged along peripheral sides thereof. An interconnecting leadframe portion connects a first peripheral side of a first one of the plurality of leadframes to a second peripheral side of a second one of the plurality of leadframes. The leads along the first peripheral side include partially etched portions. The partially etched portions of the leads are at least partially contiguous with and connected to the interconnecting leadframe portions.

10 Claims, 8 Drawing Sheets

FIG. 14

LEADFRAME WITH IMPROVED HALF-ETCH LAYOUT TO REDUCE DEFECTS CAUSED DURING SINGULATION

CROSS-REFERENCE TO RELATED APPLICATIONS

This application claims the benefit of U.S. Provisional Application No. 62/313,680, filed on Mar. 25, 2016. The entire disclosure of the application is incorporated herein by reference.

FIELD

The present disclosure relates to semiconductor packaging and more particularly to a leadframe with an improved half-etch layout to reduced short circuits caused during singulation.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Leadframes include metal structures that are located inside a package. The leadframes carry signals to/from a semiconductor die that is encapsulated in the package. The leads of the leadframe are typically connected by bond wires to pads on the semiconductor die. The leadframe, the wire bonds and the semiconductor die are encapsulated in a molding compound.

Typically, a leadframe matrix includes multiple leadframes that are connected together in a strip or an array. The leadframes are processed at the same time and then separated during singulation. As the pin pitch of the package shrinks, pin width and pin spacing also shrink. The reduction in pin pitch creates issues during singulation.

SUMMARY

A leadframe matrix for mounting and packaging semiconductor dice includes a plurality of leadframes each including leads arranged along peripheral sides thereof. An interconnecting leadframe portion connects a first peripheral side of a first one of the plurality of leadframes to a second peripheral side of a second one of the plurality of leadframes. The leads along the first peripheral side include partially etched portions. The partially etched portions of the leads are at least partially contiguous with and connected to the interconnecting leadframe portions.

In other features, the partially etched portions are half etched. The leads along the first peripheral side are generally rectangular-shaped and the partially etched portions of the leads are rectangular-shaped. The leads along the first peripheral side are generally rectangular-shaped and the partially etched portions of the leads are located at opposite corners thereof and are separated by portions that are not etched.

In other features, a shape of the partially etched portions of the leads is selected from a group consisting of rectangular shaped, arcuate shaped and triangular shaped. The leads along the first peripheral side are generally rectangular-shaped and the partially etched portions of the leads include a first portion located along a trailing edge with respect to a cutting direction. The first portion has a shape selected from a group consisting of rectangular-shaped, triangle-shaped and arcuate-shaped.

In other features, a leading edge of the leads along the first peripheral side is not etched. The partially etched portions of the leads are located along an entire outer peripheral edge of the leads. The partially etched portions of the leads are located at a leading edge and a trailing edge of the leads. The partially etched portions of the leads at the leading edge are separated from the partially etched portions of the leads at the trailing edge by a portion that is not etched.

A method for mounting and packaging semiconductor dice on a leadframe matrix includes providing a plurality of leadframes each including leads arranged along peripheral sides thereof and an interconnecting leadframe portion connecting a first peripheral side of a first one of the plurality of leadframes to a second peripheral side of a second one of the plurality of leadframes; and partially etching the leads along the first peripheral side to define partially etched portions that are at least partially contiguous with and connected to the interconnecting leadframe portions.

In other features, the partially etched portions are half etched. The leads along the first peripheral side are generally rectangular-shaped and the partially etched portions of the leads are rectangular-shaped. The leads along the first peripheral side are generally rectangular-shaped and the partially etched portions of the leads are located at opposite corners thereof and are separated by portions that are not etched.

In other features, the method includes selecting a shape of the partially etched portions of the leads from a group consisting of rectangular shaped, arcuate shaped and triangular shaped. The leads along the first peripheral side are generally rectangular-shaped and the partially etched portions of the leads include a first portion located along a trailing edge with respect to a cutting direction.

In other features, the method includes selecting a shape of the first portion from a group consisting of rectangular-shaped, triangle-shaped and arcuate-shaped. The method includes not etching a leading edge of the leads along the first peripheral side.

In other features, the partially etched portions of the leads are located along an entire outer peripheral edge of the leads. The partially etched portions of the leads are located at a leading edge and a trailing edge of the leads. The partially etched portions of the leads at the leading edge are separated from the partially etched portions of the leads at the trailing edge by a portion that is not etched.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

In the drawings, reference numbers may be reused to identify similar and/or identical elements.

DESCRIPTION

During singulation of the leadframes from a leadframe matrix, the individual leadframes are sawed between peripheral sides. As the saw strikes the leads along the peripheral sides, the leads are distorted by the saw blade and burrs can be created. The burrs may cause defects such as short-circuits or increased capacitive coupling. The systems and methods according to the present disclosure use half-etching of peripheral sides of the leads to eliminate the burrs that may cause defects.

Figure 1:
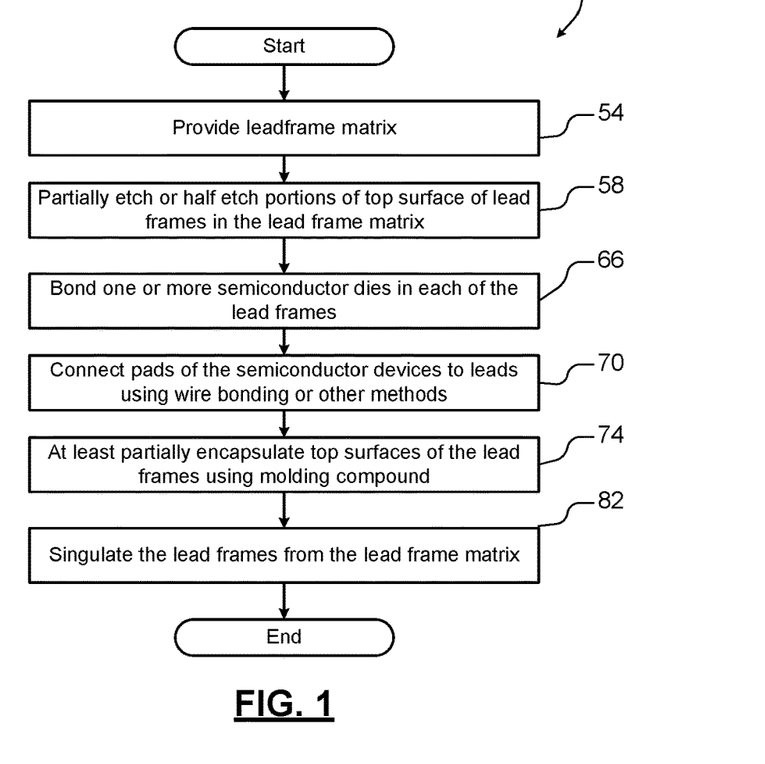
FIG. 1 is a flowchart illustrating an example of a method for packaging a semiconductor die into a package.

FIG. 1 shows an example of a method 50 for packaging a semiconductor die. At 54, a leadframe matrix is provided. In some examples, the leadframe matrix may include a strip or array of leadframes. At 58, selected portions of a top surface of each of the leadframes in a leadframe matrix are half-etched while other selected portions of the top surface of each of the leadframes are not half-etched.

As used herein, "half-etching" or partially etching does not mean only exactly removing half of the thickness of the leadframe through etching. In some examples, both of these terms refer to partial etching a thickness of the leadframe. In some examples, the etching removes thickness greater than or equal to 20% of the thickness of the leadframe. In some examples, the etching removes thickness greater than or equal to 30% of the thickness of the leadframe. In some examples, half-etching removes thickness in a range from 40% to 60% of the thickness of the leadframe. In addition to areas that are half-etched as described by the method 50 of FIG. 1, peripheral sides of the leads are half-etched according to the present disclosure in an area along a line that is sawed during singulation to reduce burrs as will be described further below.

At 66, after etching, a semiconductor die is bonded to each of the leadframes of the leadframe matrix. At 70, the semiconductor dies are connected to the respective leadframes using wire bonds or other connection methods. At 74, at least a portion of the top surfaces of the leadframes, the wire bonds and the semiconductor dies are encapsulated in a molding compound. At 82, the individual leadframes are singulated using sawing.

Figure 2:
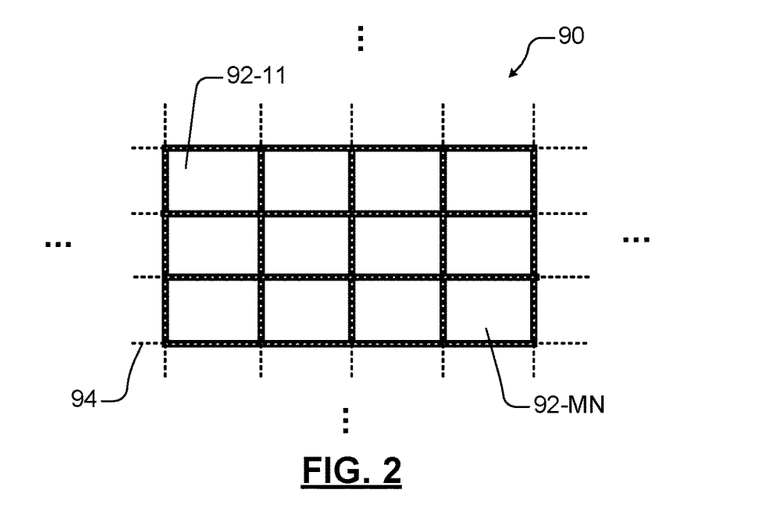
FIG. 2 is a plan view of a leadframe matrix.

FIG. 2 shows a leadframe matrix 90 including an array of leadframes 92-11, . . . , 92-MN (where M and N are integers greater than one) (collectively leadframes 92). After processing is performed, the leadframes 92 are singulated or sawed along lines 94.

Figure 3:
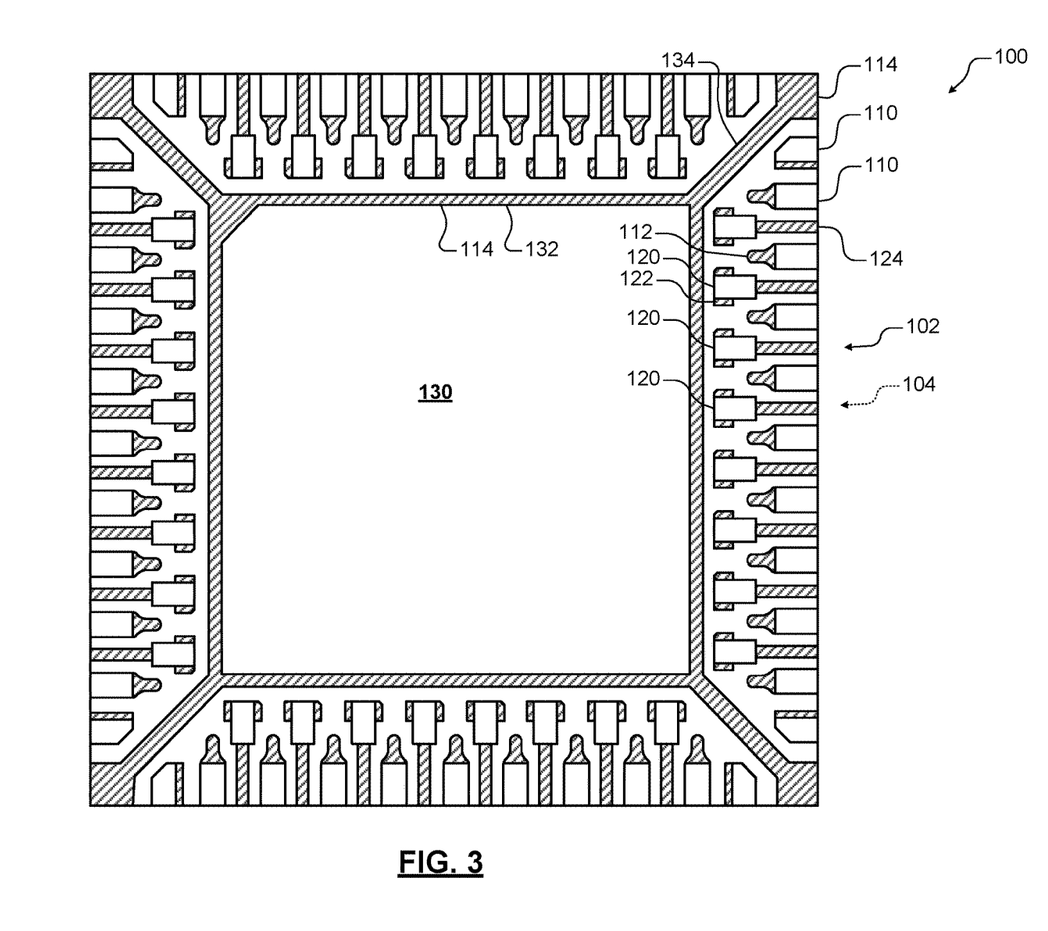
FIG. 3 is a plan view of a top side of an example of a leadframe.
Figure 4:
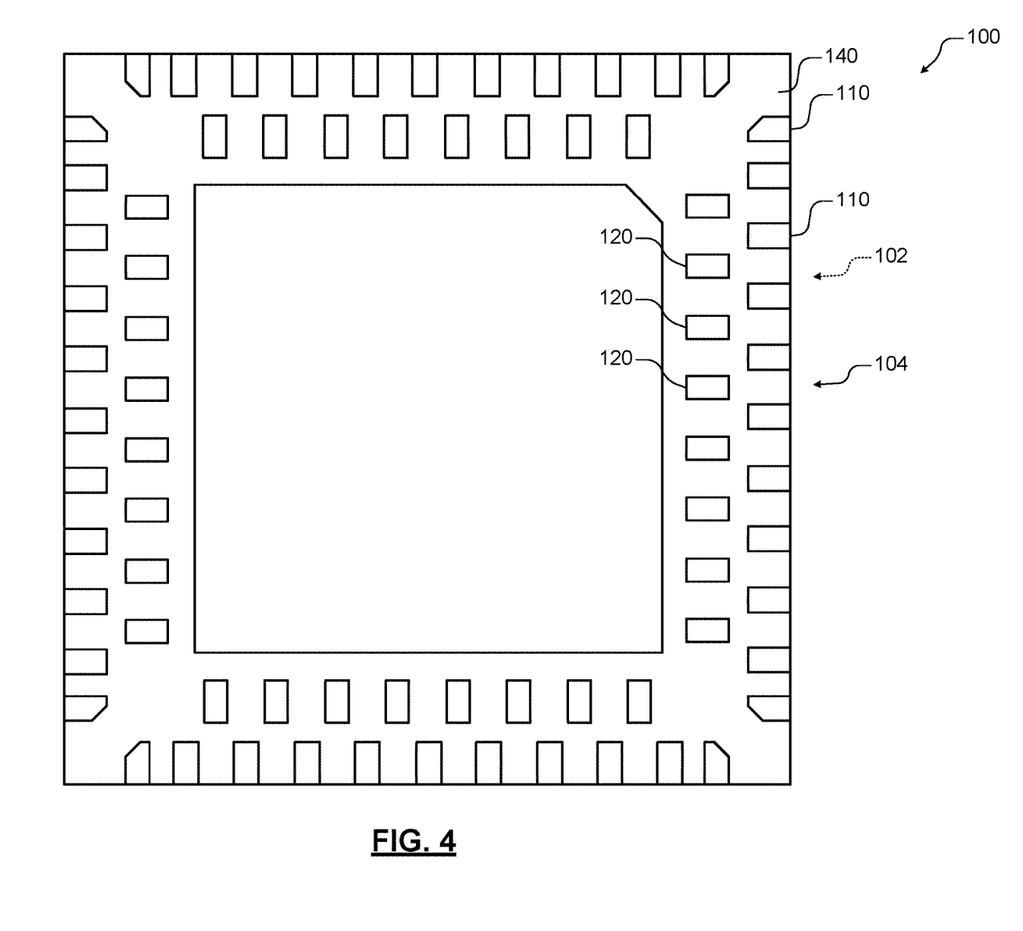
FIG. 4 is a plan view of a bottom side of the leadframe of FIG. 3.

FIGS. 3-4 show top and bottom sides of an example of a leadframe 100, respectively. In FIG. 3, the leadframe 100 includes a plurality of leads 110 arranged around an outer periphery of the leadframe 100. The leadframe 100 may further include a plurality of leads 120 that are arranged inwardly from the plurality of leads 110. The leadframe 100 further includes half-etched portions 112, 122 and 124 along sides of the leads 110 and 120. Additional half-etched portions 114 may be arranged in other locations. For example, the half-etched portions 114 may be arranged in a rectangular or square shape 132 around a central portion 130 of the leadframe 100. Diagonal portions 134 may extend from corners of the rectangular or square shape 132 to corners of the leadframe 100, although other designs may be used.

Figure 5:
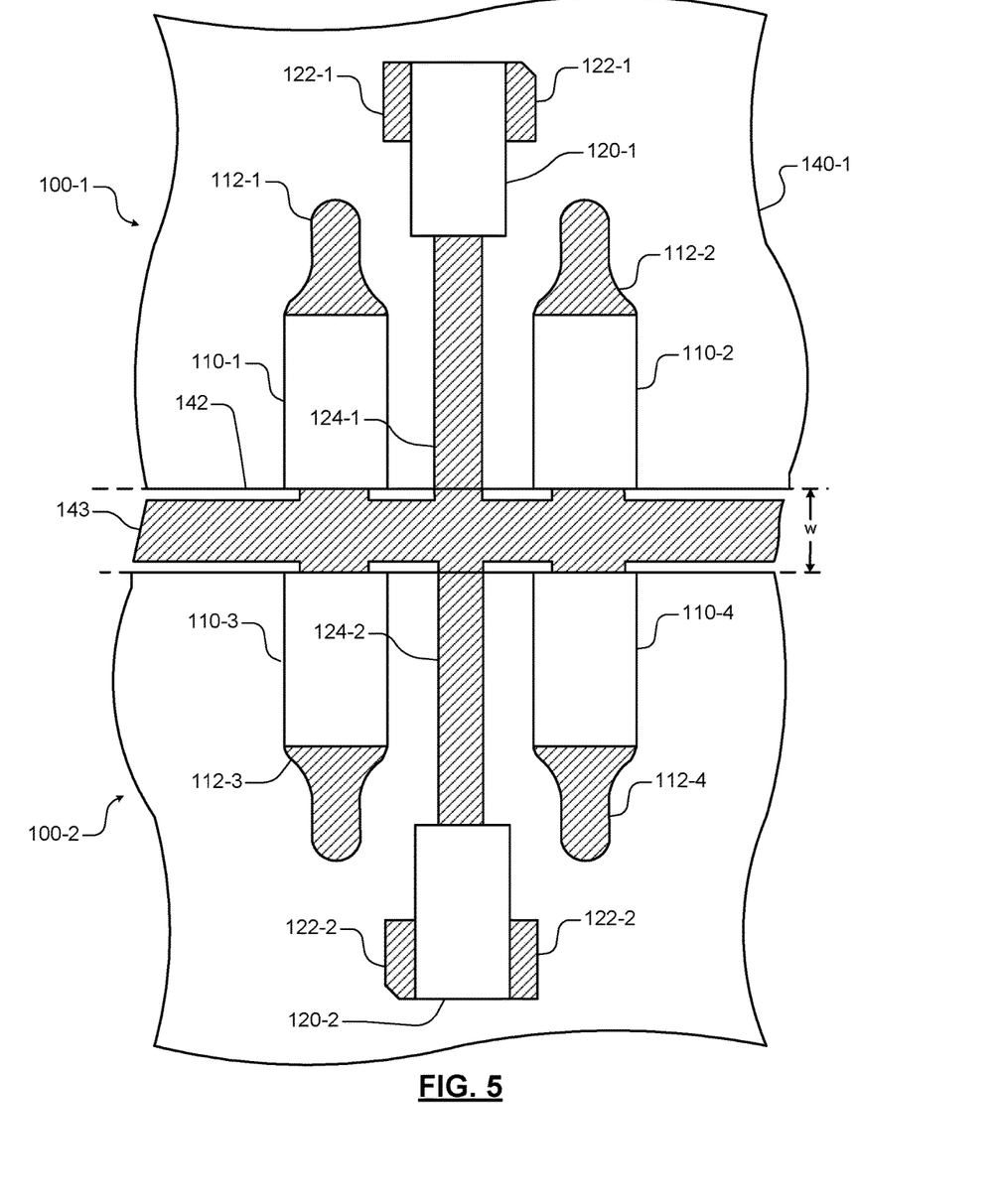
FIG. 5 is a plan view illustrating inner and outer leads of a portion of adjacent leadframes prior to singulation and half-etched portions of the leadframe.

FIG. 5 shows a portion of adjacent ones of the leadframes 100 encapsulated in molding compound 140. A leadframe 100-1 includes leads 110-1 and 110-2 arranged along an outer peripheral side of the leadframe 100-1. A lead 120-1 is arranged inwardly from the outer peripheral side of the leadframe 100-1. Half-etched portions 112-1 and 112-2 are extend inwardly from an inner edge of the leads 110-1 and 110-2, respectively. Half-etched portions 122-1 extend laterally from opposite sides of the lead 120-1. Half etched portion 124-1 extends from an outer side of the lead 120-1 to a peripheral side of the leadframe 100-1.

A leadframe 100-2 has a similar construction as the leadframe 100-1. The leadframe 100-2 includes leads 110-3 and 110-4 arranged along an outer peripheral side of the leadframe 100-2. A lead 120-2 is arranged inwardly from the outer peripheral side of the leadframe 100-2. Half-etched portions 112-3 and 112-4 extend inwardly from an inner edge of the leads 110-3 and 110-4, respectively. Half-etched portions 122-2 extend laterally from opposite sides of the lead 120-2. Half etched portion 124-2 extends from an outer edge of the lead 120-2 to the peripheral side of the leadframe 100-2.

An interconnecting half-etched portion 143 is located between adjacent ones of the leadframes 100-1 and 100-2. During sawing, the interconnecting half-etched portion 143 is removed. The interconnecting half-etched portion 143 is connected to the leadframes 100-1 and 100-2 adjacent to outer peripheral sides of the leads 110-1, 110-2, 110-3 and 110-4 and half-etched portions 124-1 and 124-2 at spaced locations along contiguous portions thereof. The leadframe 100 may be sawed along lines 142 using a saw having a width w to separate the leadframes 100-1 and 100-2.

Figure 6:
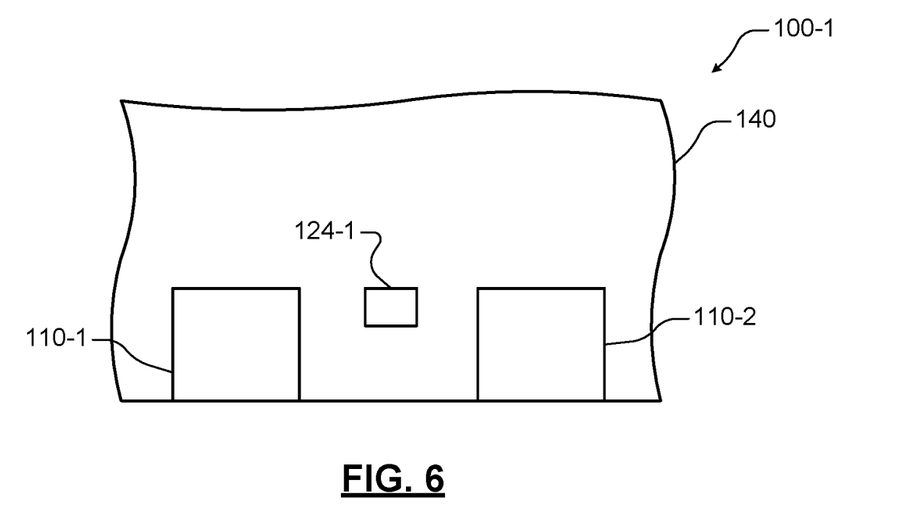
FIG. 6 is a side cross-sectional view of the leads before singulation.
Figure 7:
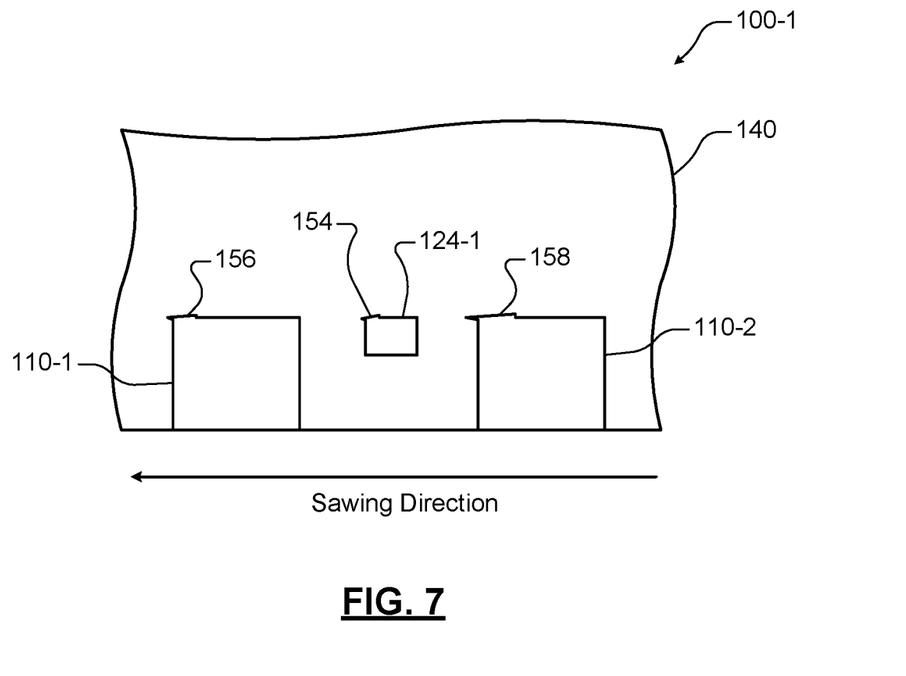
FIG. 7 is a side cross-sectional view of leads after singulation with burrs caused during singulation.

FIGS. 6-7 show inner and outer leads of a portion of the leadframe and half-etched portions after singulation. In FIG. 6, the leads 110-1 and 110-2 and the half-etched portion 124-1 are shown prior to singulation. Edges of the leads 110-1 and 110-2 and the half etched portion 124-1 are distorted by sawing as shown in FIG. 7. Burrs are created during singulation as can be seen at 154, 156 and 158. As the pitch width decreases, the distortion or burrs 154, 156 and 158 may extend close enough to adjacent leads to cause a short or capacitive coupling.

Figure 8:
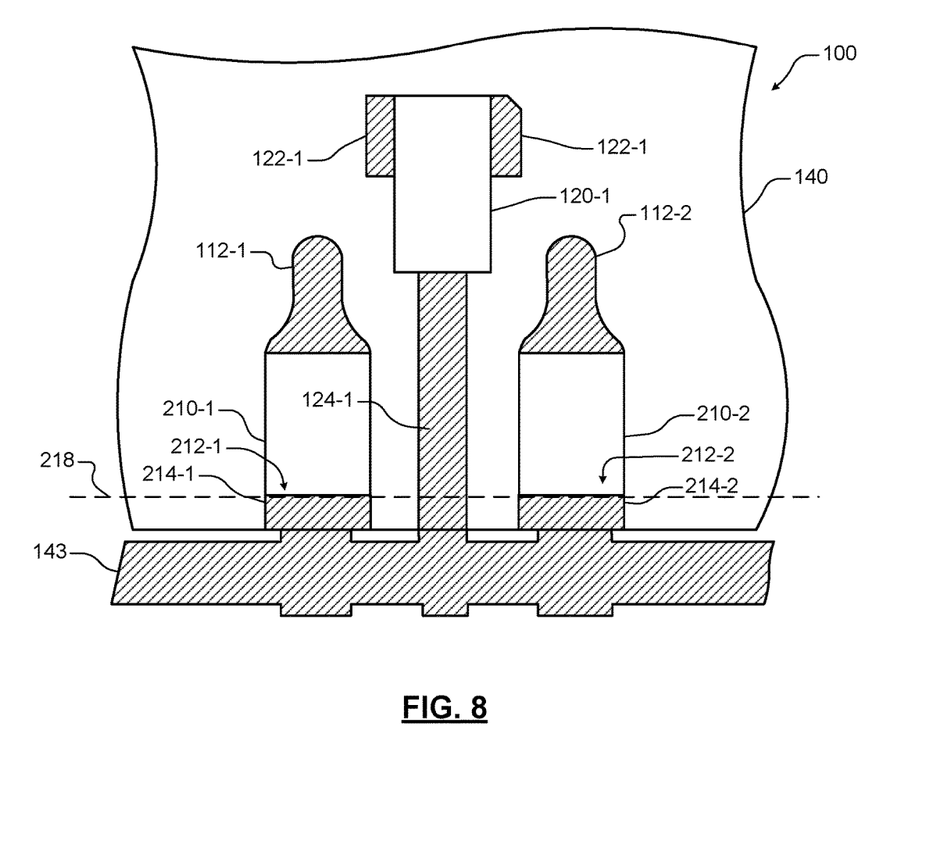
FIG. 8 is a plan view illustrating inner and outer leads of a portion of the leadframe and half-etched portions of the leadframe according to the present disclosure.
Figure 9:
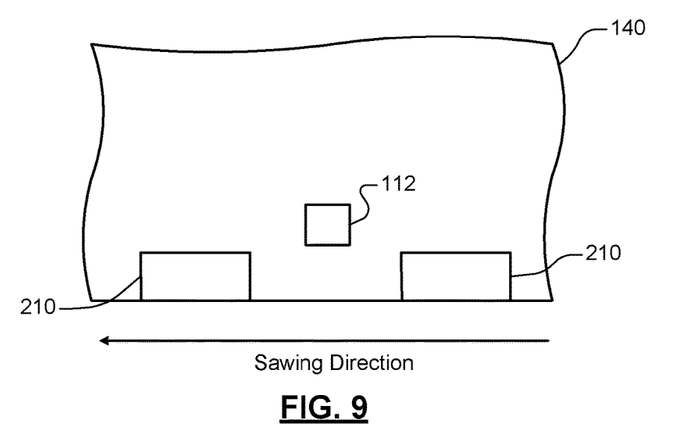
FIG. 9 is a side cross-sectional view of leads corresponding to FIG. 8 without burrs caused during singulation.

FIGS. 8-9 show inner and outer leads of a portion of the leadframe and half-etched portions according to the present disclosure. The leadframe 100 includes leads 210-1 and 210-2 arranged along an outer peripheral side of the leadframe 100. Outer peripheral sides 212-1 and 212-2 of the leads 210-1 and 210-2, respectively, are half-etched to create half-etched portions 214-1 and 214-2, respectively. During singulation, an edge of a sawing line 218 traverses the half-etched portions 214-1 and 214-2. In this example, the interconnecting half-etched portion 143 is connected to the half-etched portions 214-1 in 214-2 and to the half etched portion 124-1 at spaced locations along contiguous portions thereof. In the example in FIG. 8, the additional half-etched portions 214-1 and 214-2 have a generally rectangular shape, although other shapes may be used. In FIG. 9, the package is shown without burrs caused during singulation.

Figure 10:
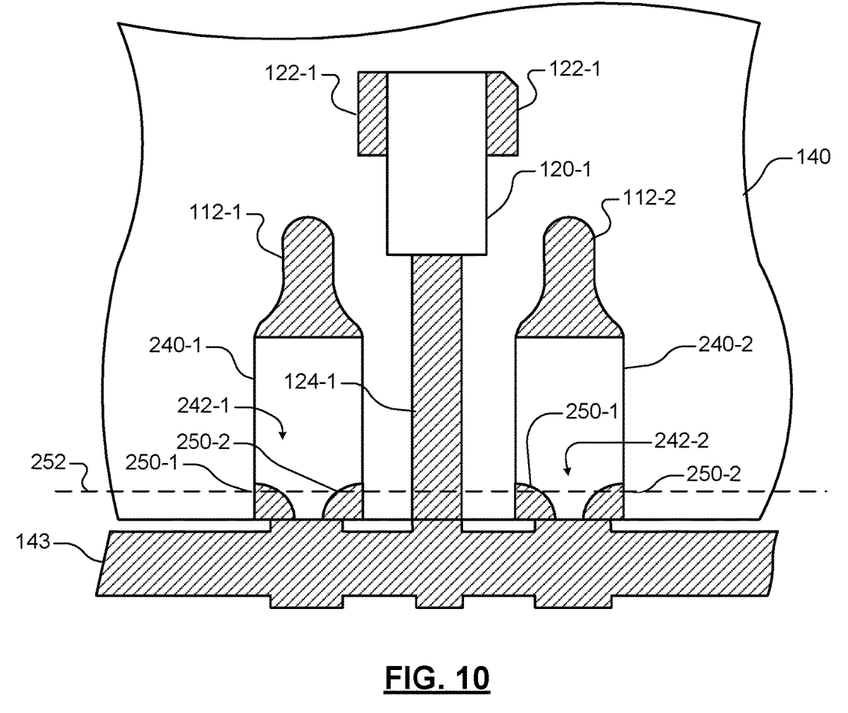
FIG. 10 is a plan view illustrating inner and outer leads of a portion of the leadframe and half-etched portions of the leadframe according to the present disclosure.
Figure 11:
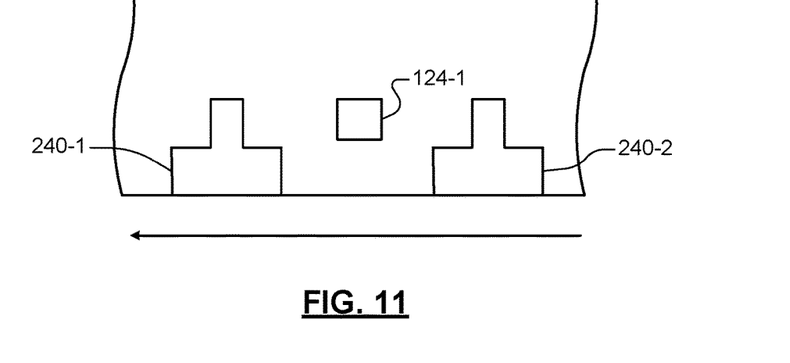
FIG. 11 is a side cross-sectional view of leads corresponding to FIG. 10 without burrs caused during singulation according to the present disclosure.

FIGS. 10-11 show inner and outer leads of a portion of the leadframe, the half-etched portions of FIG. 3 and additional half-etched portions according to the present disclosure. The leadframe 100 includes leads 240-1 and 240-2 arranged along an outer peripheral side of the leadframe 100. Outer peripheral sides 242-1 and 242-2 of the leads 240-1 and 240-2, respectively, are partially half-etched to create half-etched portions 250-1 and 250-2, respectively. During singulation, the sawing line 252 traverses the half-etched portions 250-1 and 250-2 and defects are reduced. In this example, the interconnecting half-etched portion 143 is connected to the half-etched portions 250-1 and 250-2, the leads 240-1 and 240-2, and the half etched portion 124-1 at spaced locations along contiguous portions thereof. In the example in FIG. 10, the half-etched portions 250-1 and 250-2 are separated by a middle portion that is not etched. The half-etched portions 250-1 and 250-2 have a quarter circle shape, pie shape, or arcuate shape, although other shapes may be used. In FIG. 11, the package is shown without burrs caused during singulation.

Figures 12, 13:
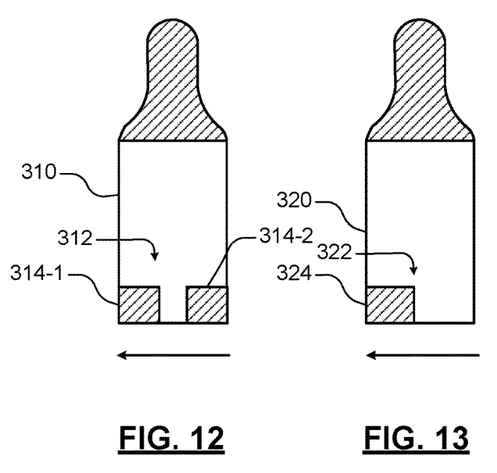
FIGS. 12-14 show additional examples of half-etching patterns of the leads along a saw line.
Figure 14:
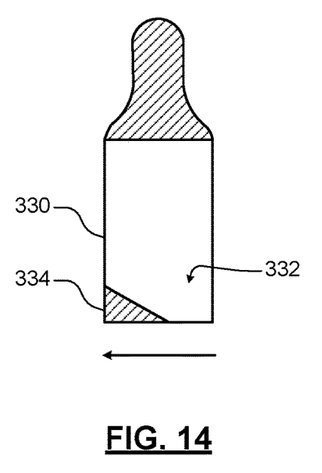

FIGS. 12-14 show additional examples of half-etching patterns along a peripheral side of the leads. In FIG. 12, first and second rectangular half-etched portions 314-1 and 314-2 are arranged in a spaced relationship at a peripheral side 312 of the lead 310 along the saw line. A center portion between the rectangular half-etched portions 314-1 and 314-2 is not half-etched. In FIG. 13, one rectangular half-etched portion 324 is arranged on a trailing edge of the lead 320 at a peripheral side 312 thereof with respect to a direction of the sawing line. In FIG. 14, one triangular half-etched portion 334 is arranged on a trailing edge of the lead 330 at a peripheral side 312 thereof with respect to a direction of the sawing line. As can be appreciated, defects are reduced since burrs will not extend beyond the edge of the lead in the examples in FIGS. 11-13. As can be appreciated, other half-etch patterns can be used along the saw line to reduce burrs.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

What is claimed is:

1. A method for mounting and packaging semiconductor dice on a leadframe matrix, the method comprising:
   providing a plurality of leadframes each including: i) leads arranged along peripheral sides thereof and ii) an interconnecting leadframe portion connecting a first peripheral side of a first one of the plurality of leadframes to a second peripheral side of a second one of the plurality of leadframes;
   partially etching the leads arranged along the first peripheral side to define partially etched portions that are at least partially contiguous with and connected to the interconnecting leadframe portions, wherein a thickness of the partially etched portions of the leads is less than a thickness of remaining portions of the leads;
   encapsulating the leads in a molding compound, wherein encapsulating the leads includes encapsulating the partially etched portions of the leads that are connected to the interconnecting leadframe portions; and
   cutting the leads from the interconnecting leadframe portions, wherein cutting the leads includes cutting through the molding compound along a line on a lead side of the partially etched portions of the leads such that the partially etched portions that are connected to the interconnecting leadframe portions are removed from the leads.

2. The method of claim 1, wherein the partially etched portions are half etched.

3. The method of claim 1, wherein the leads along the first peripheral side are generally rectangular-shaped and the partially etched portions of the leads are rectangular-shaped.

4. The method of claim 1, wherein the leads along the first peripheral side are generally rectangular-shaped and the partially etched portions of the leads are located at opposite corners thereof and are separated by portions that are not etched.

5. The method of claim 4, further comprising selecting a shape of the partially etched portions of the leads from a group consisting of rectangular shaped, arcuate shaped and triangular shaped.

6. The method of claim 1, wherein the leads along the first peripheral side are generally rectangular-shaped and the partially etched portions of the leads include a first portion located along a trailing edge with respect to a cutting direction.

7. The method of claim 6, further comprising selecting a shape of the first portion from a group consisting of rectangular-shaped, triangle-shaped and arcuate-shaped.

8. The method of claim 6, further comprising not etching a leading edge of the leads along the first peripheral side.

9. The method of claim 1, wherein the partially etched portions of the leads are located along an entire outer peripheral edge of the leads.

10. The method of claim 1, wherein the partially etched portions of the leads are located at a leading edge and a trailing edge of the leads and wherein the partially etched portions of the leads at the leading edge are separated from the partially etched portions of the leads at the trailing edge by a portion that is not etched.

* * * * *